United States Patent [19]

Reber

[11] Patent Number: 4,745,396

[45] Date of Patent: May 17, 1988

[54] DECODER CIRCUIT FOR GENERATING LOGICAL SIGNALS IN RESPONSE TO THE ACTUATION OF A KEYBOARD PROVIDED WITH SYMBOLS ASSOCIATED WITH RESPECTIVE LOGICAL SIGNALS

[75] Inventor: Karl Reber, Kloster Indersdorf, Fed. Rep. of Germany

[73] Assignee: Firma Hans Widmaier, Fabrik fur Apparate der Fernmelde—und Feinwerktechnik, Fed. Rep. of Germany

[21] Appl. No.: 840,119

[22] Filed: Mar. 14, 1986

[30] Foreign Application Priority Data

Mar. 18, 1985 [DE] Fed. Rep. of Germany ....... 3509742

[51] Int. Cl.⁴ ............................................. G06F 3/023
[52] U.S. Cl. .............................. 340/365 R; 340/365 S
[58] Field of Search ............ 340/365 R, 365 S, 365 E, 340/711

[56] References Cited

U.S. PATENT DOCUMENTS

| | | | |
|---|---|---|---|
| 4,335,374 | 6/1982 | Nyuji | 340/365 S |
| 4,400,593 | 8/1983 | Kunz | 340/365 R |
| 4,543,563 | 9/1985 | Wine | 340/365 S |

FOREIGN PATENT DOCUMENTS 0071037 5/1982 Japan .............................. 340/365 R

OTHER PUBLICATIONS

Nassimbene, "Touch Actuated Keyboard", IBM Technical Disclosure Bulletin, vol. 18, No. 12, May 1976, pp. 4140–4141.

Primary Examiner—John W. Caldwell, Sr.
Assistant Examiner—Alvin Oberley
Attorney, Agent, or Firm—Fishman, Dionne & Cantor

[57] ABSTRACT

A keyboard is provided, in which only alternate keys of each row of keys and only alternate keys of each column of keys are connected to switches; and in which a square array consisting of four adjacent keys is associated with each of a plurality of symbol fields. Each of the keys, with the exception of the terminal keys of the rows and columns, are associated with four symbol fields provided with respective symbols. The switches are connected to row conductors associated with respective rows of keys and to column conductors associated with respective columns of keys. In conjunction with such a keyboard, commercially available decoders can be used for decoding if interrogation input signals are delivered to consecutive input terminals and consecutive output terminals are tested for the presence of output signals. This is accomplished by connecting each column conductor to an output of an associated OR gate, the interrogation input signals being delivered to leads connecting corresponding input terminals of adjacent ones of the OR gates; and adjacent row connectors being connected to respective input terminals of AND gates, the output terminals of which constitute the readout terminals.

15 Claims, 1 Drawing Sheet

DECODER CIRCUIT FOR GENERATING LOGICAL SIGNALS IN RESPONSE TO THE ACTUATION OF A KEYBOARD PROVIDED WITH SYMBOLS ASSOCIATED WITH RESPECTIVE LOGICAL SIGNALS

BACKGROUND OF THE INVENTION

This invention relates to a decoder circuit for generating logical signals in response to the actuation of a keyboard provided with symbols associated with respective logical signals for use with a keyboard which is provided with a plurality of symbol fields. The symbol fields are adapted to be provided with respective ones of said symbols and are separated by gaps between adjacent keys and defined by a plurality of adjacent keys. The adjacent keys are adapted to be jointly depressed by a finger of an operator, wherein a plurality of adjacent keys are associated with each of said symbol fields in such a manner that each key of the keyboard, with the exception of keys disposed at the edges of the keyboard, is associated with four adjacent symbol fields. Only alternate keys of each column of keys of the keyboard are connected to electric switches for generating the logical signals. Each of these switches comprises a contact connected to one of a plurality of row conductors associated with respective rows of keys; and another contact connected to one of a plurality of column conductors associated with respective columns of keys.

Decoder circuits may be used in association with keyboards which are of the type briefly described hereinbefore and disclosed in, for example, German Pat. specification No. 27 29 157 corresponding to U.S. Pat. No. 4,400,593, assigned to the assignee hereof.

In the prior art keyboard described in U.S. Pat. No. 4,400,593, the number of keys of each row of keys is larger by one than the number of symbols associated with each row; and the number of keys of each column of keys is larger by one than the number of symbols associated with the said column. For this reason, the number of row conductors connected to respective rows of keys is larger by one than the number of symbols of a row of symbols; and the number of column conductors associated with a column of keys is larger by one than the number of symbols of a column of symbols.

If the signals that can be derived from the row conductors and column conductors are decoded in such a manner that input signals are delivered to individual column conductors and the output signals are then read from the row conductors, the above-mentioned difference between the number of symbols in a row of keys and the number of row conductors, and between the number of symbols in a column of keys and the number of column conductors, will give rise to difficulties if such decoding is effected with known decoder circuits.

SUMMARY OF THE INVENTION

The above-discussed and other problems and dificiencies of the prior art are overcome or alleviated by the decoder circuit of the present invention. In accordance with the present invention, a decoder circuit of the type hereinabove described is provided wherein the interrogation input terminals are equal in number to the number of symbols in a row of symbols; and readout terminals are equal in number to the number of rows of symbols. It will be appreciated that the definitions of a row of keys and of a column of keys; as well as the definitions of a row conductor and of a column conductor are entirely arbitrary. As will readily be understood by a person skilled in the art, these definitions may be interchanged in connection with a given keyboard in such a manner that the interrogation input terminals are associated with the row conductors and the readout terminals are associated with the column conductors.

The decoder circuit of the present invention is constructed such that each column conductor is coupled to the output terminals of an associated OR gate while the two input terminals of each OR gate that is associated with a column of keys at an edge of the keyboard are interconnected. One input terminal of a given OR gate and one input terminal of an adjacent OR gate are connected by leads. Row conductors associated with adjacent rows of keys are connected to respective input terminals of an associated AND gate. Also, means are provided for delivering successive input signals to the leads between adjacent OR gates and means are also provided for detecting successive logical signals corresponding to an actuated group of keys at the output terminals of the said AND gates.

The OR gates may be connected to the column conductors by diodes having the same polarity. The input terminals of the AND gates are grounded via resistors, which ensure that a given input terminal will reliably assume a logical zero signal level when no signal appears at that input terminal.

The above discussed and other features and advantages of the present invention will be apparent to and understood to those skilled in the art from the following detailed description and drawings.

BRIEF DESCRIPTION OF THE DRAWINGS:

Referring now to the drawings, wherein like elements are numbered alike in the several Figures.

DESCRIPTION OF THE PREFERRED EMBODIMENT

Figure 1:
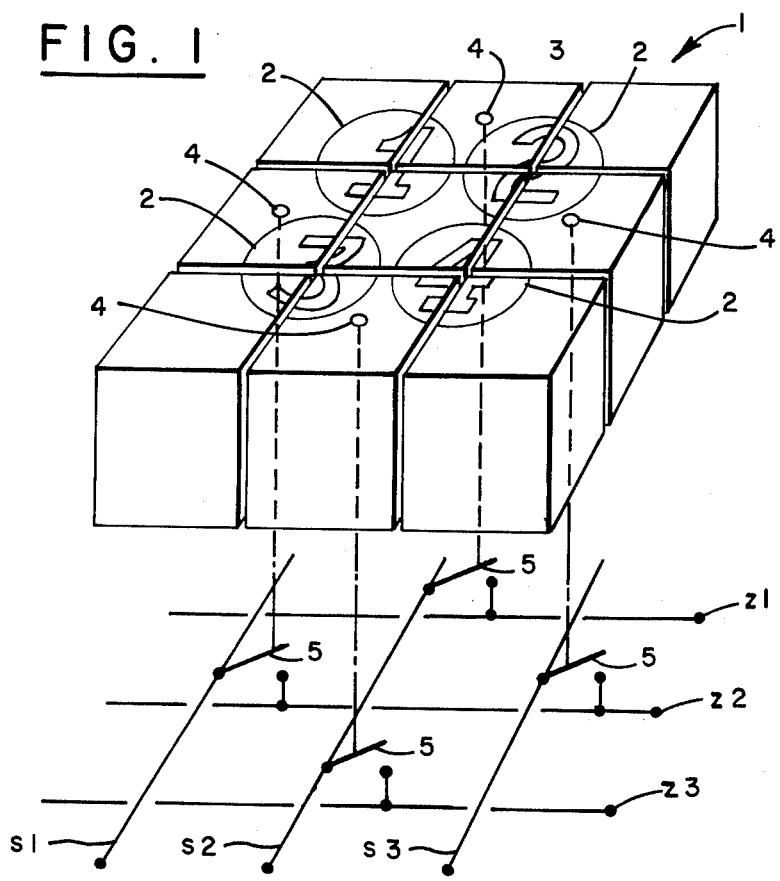
FIG. 1 is a diagrammatic perspective view showing a keyboard, switches associated with individual keys, and row conductors and column conductors connected to the switches.

In the particular embodiment of the present invention shown in FIG. 1, the keyboard identified generally at 1 comprises a total of nine movable keys. Each group of three juxtaposed keys constitute a row of keys. Each group of three keys aligned in a direction at right angles to the rows constitute a column of keys. A person skilled in the art will readily appreciate that the above-described construction can also be selected for a keyboard in which a much larger number of keys are arranged in each row and/or each column.

A symbol is provided on each of the symbol fields 2, each of which is defined by a square array of four keys. With the exception of the terminal keys of the rows and columns, each key, i.e., in the present case only the central key 3, is associated with four adjacent symbol fields 2. As a result, each symbol field 2 is associated with the intersection of vertical and horizontal gaps extending between keys of the keyboard.

In FIG. 1, a dot 4 is shown on the surface of those keys which, in an actuated position, are coupled to an electric switch 5 so that the actuation of each key will result in the generation of an electric signal. The keys provided with such dots 4 define alternate keys of each row of keys, and alternate keys of each column of keys. In a square array of adjacent keys, those keys which are connected to respective switching elements 5 are diagonally aligned.

Each swtich 5 comprises a contact that is connected to one of the line conductors Z1, Z2, and Z3, which are associated with respective keys of a row of keys. The other contact of each switching element 5 is connected to one of the column conductors S1, S2, and S3, which are associated with respective columns of keys.

In a preferred embodiment, the stems of the keys are guided in a gridlike key guiding matrix and contact well known snap-action coupling elements of an elastically deformable switch diaphragm. Adjacent to the coupling elements, that diaphragm is provided with contacts which, in response to a deformation of the snap-action coupling elements, are adapted to bridge sets of contacts provided on a circuit board so as to actuate the switching elements. Details of such snap-action switches are known in the art and therefore are not shown in the drawings.

Figure 2:
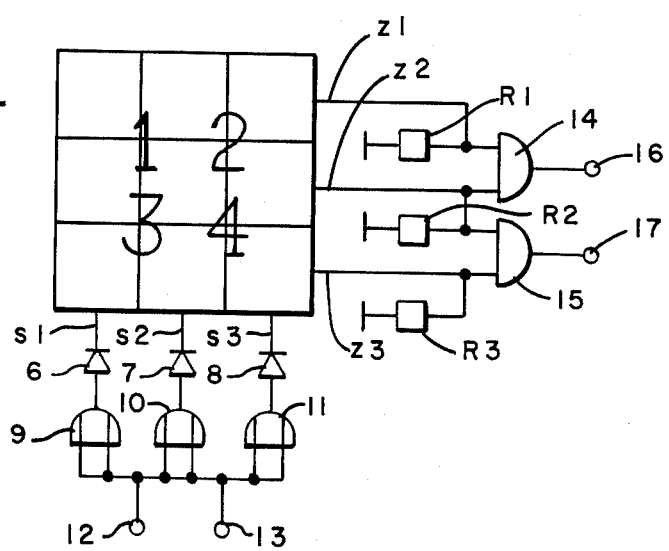
FIG. 2 is a schematic diagram showing a portion of a decoder circuit, and of a associated keyboard without the circuitry, for generating interrogation input signals and for processing readout signals.

Referring now to FIG. 2, each of the column conductors S1 to S3 is connected by an associated diode 6, 7 or 8 to the output of an associated OR gate 9, 10 or 11. One input terminal of each of the OR gates is connected to the corresponding input terminal of the adjacent OR gate by a lead; and each of the leads is connected to one of the interrogation input terminals 12 and 13 in the manner shown in FIG. 2. Each OR gate, which is associated with a column of keys at an edge of the keyboard (i.e., in the present case, each of the OR gates 9 and 11), has its input terminals connected to each other.

Each of the row conductors Z1 to Z3 is grounded via one of the resistors $R_1$ and $R_3$ so that the line conductor will be kept at a zero potential when no signal is delivered thereto. The row conductors associated with adjacent rows of keys are connected to respective input terminals of one of the AND gates 14 and 15, which have respective output terminals 16 and 17. Output terminals 16 and 17 constitute readout terminals.

It should be apparent to those skilled in the art from the foregoing description that a conventional decoder can be connected to the interrogation input terminals 12 and 13, and to the readout terminals 16 and 17, of the circuit shown in FIGURES 1 and 2. The decoder may be operated to deliver consecutive interrogation input signals to the input terminals and to test consecutive output terminals for the presence of output signals. As a result, the input terminals 12 and 13 are associated with columns of symbols, rather than with columns of keys as in the prior art. In the embodiment described herein, the keys are associated with the column of symbols 1 and 3 and with the column of symbols 2 and 4. Similarly, the output terminals 16 and 17 are associated with rows of symbols rather than with rows of keys as in the prior art; and in the embodiment described herein, are associated with the row of symbols 1 and 2 and with the row of symbols 3 and 4.

The OR gates 9, 10 and 11, the AND gates 14 and 15 and, if desired, the diodes 6, 7 and 8 and the grounding resistors R1, R2 and R3 may consist entirely, or in part, of integrated circuits. In this way, the design of the entire circuit of the present invention may be simplified.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A decoder circuit for generating logical signals in response to the actuation of a keyboard provided with symbols associated with respective logical signals, being provided with a plurality of symbol fields, which are adapted to be provided with respective ones of said symbols and are separated by gaps between adjacent keys and defined by a plurality of adjacent keys which are adapted to be jointly depressed by a finger of an operator wherein:

the plurality of adjacent keys are associated with each of said symbol fields whereby each key of said keyboard, with the exception of keys disposed at the edges of the keyboard, is associated with four adjacent symbol fields and only alternate keys of each row of keys of the keyboard and only alternate keys of each column of keys of the keyboard are connected to electric switches for generating the logical signals;

each of said switches comprising a contact connected to one of a plurality of row conductors associated with respective rows of keys, and another contact connected to one of a plurality of column conductors associated with respective columns of keys;

each column conductor being coupled to an output terminal of an associated OR gate;

two input terminals of each OR gate being associated with a column of keys at the edge of the keyboard and being interconnected, one input terminal of a given OR gate and one input terminal of an adjacent OR gate being connected by leads;

row conductors associated with adjacent rows of keys being connected to respective input terminals of an associated AND gate;

means for delivering successive input signals to said leads between adjacent OR gates; and means for detecting successive logical signals corresponding to an actuated group of keys at the output terminals of said AND gates.

2. The decoder circuit of claim 1 including:
rectifier means being connected between said output terminal of each OR gate and said associated column conductor.

3. The decoder circuit of claim 1 wherein:
each row conductor is grounded by a grounding resistor.

4. The decoder circuit of claim 2 wherein:
each row conductor is grounded by a grounding resistor.

5. The decoder circuit of claim 1 wherein:
said OR gates are at least partly incorporated into integrated circuits.

6. The decoder circuit of claim 2 wherein:
said OR gates are at least partly incorporated into integrated circuits.

7. The decoder circuit of claim 3 wherein:
said OR gates are at least partly incorporated into integrated circuits.

8. The decoder circuit of claim 2 wherein:
said rectifier means is at least partly incorporated into integrated circuits.

9. The decoder circuit of claim 4 wherein:

said rectifier means is at least partly incorporated into integrated circuits.

10. The decoder circuit of claim 6 wherein:

said rectifier means is at least partly incorporated into integrated circuits.

11. The decoder circuit of claim 3 wherein:

said ground resistor is at least partly incorporated into integrated circuits.

12. The decoder circuit of claim 7 wherein:

said ground resistor is at least partly incorporated into integrated circuits.

13. The decoder circuit of claim 1 wherein:

said AND gates are at least partly incorporated into integrated circuits.

14. The decoder circuit of claim 2 wherein:

said AND gates are at least partly incorporated into integrated circuits.

15. The decoder circuit of claim 3 wherein:

said AND gates are at least partly incorporated into integrated circuits.

* * * * *